(12) United States Patent
Wei

(10) Patent No.: US 11,664,435 B2
(45) Date of Patent: May 30, 2023

(54) DYNAMIC RANDOM ACCESS MEMORY AND METHOD OF FABRICATING THE SAME

(71) Applicant: Winbond Electronics Corp., Taichung (TW)

(72) Inventor: Hung-Yu Wei, Taichung (TW)

(73) Assignee: Winbond Electronics Corp., Taichung (TW)

( * ) Notice: Subject to any disclaimer, the term of this patent is extended or adjusted under 35 U.S.C. 154(b) by 44 days.

(21) Appl. No.: 17/464,714

(22) Filed: Sep. 2, 2021

(65) Prior Publication Data
US 2022/0344343 A1    Oct. 27, 2022

(30) Foreign Application Priority Data
Apr. 27, 2021    (TW) .................. 110115134

(51) Int. Cl.
*H01L 29/423* (2006.01)
*G11C 11/408* (2006.01)

(52) U.S. Cl.
CPC ...... *H01L 29/4236* (2013.01); *G11C 11/4085* (2013.01); *H10B 12/05* (2023.02); *H10B 12/34* (2023.02); *H10B 12/488* (2023.02)

(58) Field of Classification Search
None
See application file for complete search history.

(56) References Cited

U.S. PATENT DOCUMENTS

| 4,789,560 A * | 12/1988 | Yen ................... H01L 21/76227 257/E21.507 |
| 9,368,589 B2 | 6/2016 | Baek et al. |
| 2017/0125532 A1 | 5/2017 | Jang |
| 2018/0212030 A1 | 7/2018 | Wu et al. |
| 2018/0342613 A1* | 11/2018 | Chang ............... H01L 21/76224 |
| 2019/0057967 A1 | 2/2019 | Chang et al. |
| 2020/0381436 A1 | 12/2020 | Noh et al. |

FOREIGN PATENT DOCUMENTS

| CN | 111668298 | 9/2020 |
| TW | 201906089 | 2/2019 |

OTHER PUBLICATIONS

"Office Action of Taiwan Counterpart Application", dated Nov. 5, 2021, p. 1-p. 9.

* cited by examiner

Primary Examiner — Nicholas J Tobergte
Assistant Examiner — Kevin Quinto
(74) Attorney, Agent, or Firm — JCIPRNET

(57) ABSTRACT

A dynamic random access memory includes a substrate, an isolation structure, and a buried word line structure. The isolation structure is located in the substrate and defines multiple active regions. The buried word line structure is located in a word line trench in the substrate, and the word line trench passes through the active regions and the isolation structure. The buried word line structure includes a gate conductive layer, a first gate dielectric layer, and a second gate dielectric layer. The gate conductive layer is located in the word line trench. The first gate dielectric layer is located on a sidewall and a bottom surface of the word line trench. The second gate dielectric layer is located between the first gate dielectric layer and the gate conductive layer, and a top surface of the second gate dielectric layer is lower than a top surface of the gate conductive layer.

19 Claims, 15 Drawing Sheets

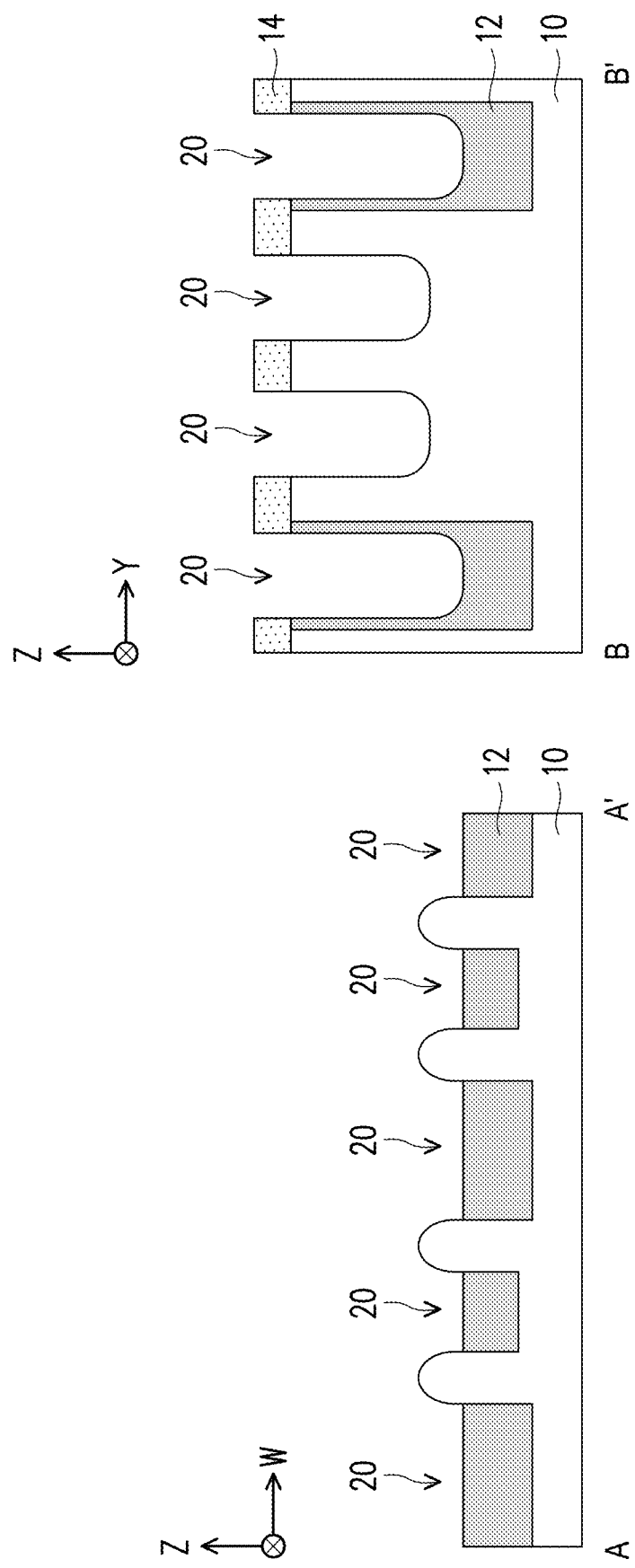

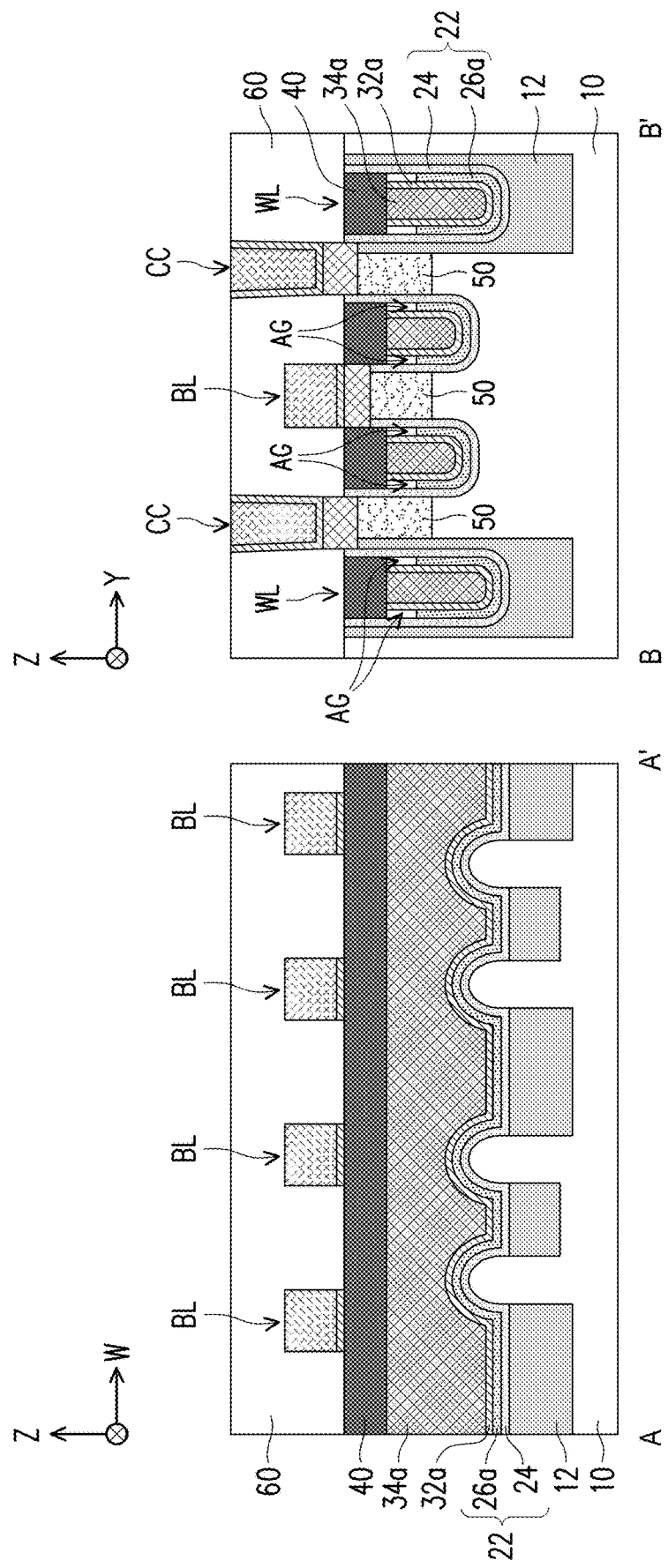

DYNAMIC RANDOM ACCESS MEMORY AND METHOD OF FABRICATING THE SAME

CROSS-REFERENCE TO RELATED APPLICATION

This application claims the priority benefit of Taiwan application serial no. 110115134, filed on Apr. 27, 2021. The entirety of the above-mentioned patent application is hereby incorporated by reference herein and made a part of this specification.

BACKGROUND

Technical Field

The disclosure relates to a dynamic random access memory and a fabricating method thereof.

Description of Related Art

The capacity of a dynamic random access memory directly affects the access speed and performance of the memory, such as a write recovery time (tWR) and a refresh performance. However, as the size of the dynamic random access memory design continues to decrease and semiconductor devices continue to develop toward a higher degree of integration, how to improve the performance of the dynamic random access memory has become an urgent problem in this field.

SUMMARY

An embodiment of the disclosure provides a dynamic random access memory including a substrate, an isolation structure, and a buried word line structure. The isolation structure is located in the substrate, and the isolation structure defines a plurality of active regions. The buried word line structure is located in a word line trench of the substrate, and the word line trench passes through the active regions and the isolation structure. The buried word line structure includes a gate conductive layer, a first gate dielectric layer, and a second gate dielectric layer. The gate conductive layer is located in the word line trench. The first gate dielectric layer is located on a sidewall and a bottom surface of the word line trench. The second gate dielectric layer is located between the first gate dielectric layer and the gate conductive layer, and a top surface of the second gate dielectric layer is lower than a top surface of the gate conductive layer.

An embodiment of the disclosure provides a method of fabricating a dynamic random access memory, including the following steps. A substrate is provided. An isolation structure is formed in the substrate, and the isolation structure defines a plurality of active regions. A word line trench is formed in the substrate and the isolation structure, and the word line trench passes through the active regions and the isolation structure. A buried word line structure is formed in the word line trench. The step of forming the buried word line structure in the word line trench includes the following steps. A first gate dielectric layer, a second gate dielectric layer, and a gate conductive layer are formed on the substrate and in the word line trench, and a dielectric constant of the second gate dielectric layer is greater than a dielectric constant of the first gate dielectric layer. The gate conductive layer outside the word line trench and part of the gate conductive layer in the word line trench is removed. The second gate dielectric layer outside the word line trench and part of the second gate dielectric layer in the word line trench is removed, so that a top surface of the remaining second gate dielectric layer is lower than a top surface of the remaining gate conductive layer. A cap is formed in the word line trench to cover the top surface of the remaining gate conductive layer.

Based on the above, the dynamic random access memory in the embodiment of the disclosure has multiple gate dielectric layers and an air gap, so it is possible to improve the reliability of the gate dielectric layer, increase the on-current, and further reduce various leakage currents.

In addition, in the method of fabricating the dynamic random access memory of the embodiment of the disclosure, the material and thickness of the first gate dielectric layer and the second gate dielectric layer and the depth of the air gap can be flexibly adjusted according to the electrical properties or characteristics of the device as required. In the fabricating process of the disclosure, it is not required to add an additional mask for patterning the first gate dielectric layer or/and the second gate dielectric layer, so the production cost will not be significantly increased.

BRIEF DESCRIPTION OF THE DRAWINGS

FIG. 2A to FIG. 2G are cross-sectional views taken along line A-A' in FIG. 1A to FIG. 1G.

FIG. 3A to FIG. 3G are cross-sectional views taken along line B-B' in FIG. 1A to FIG. 1G.

DESCRIPTION OF THE EMBODIMENTS

FIG. 1A to FIG. 1G are top views showing multiple stages of a DRAM fabricating method. FIG. 2A to FIG. 2G are cross-sectional views taken along line A-A' in FIG. 1A to FIG. 1G. FIG. 3A to FIG. 3G are cross-sectional views taken along line B-B' in FIG. 1A to FIG. 1G.

Figure 1A:
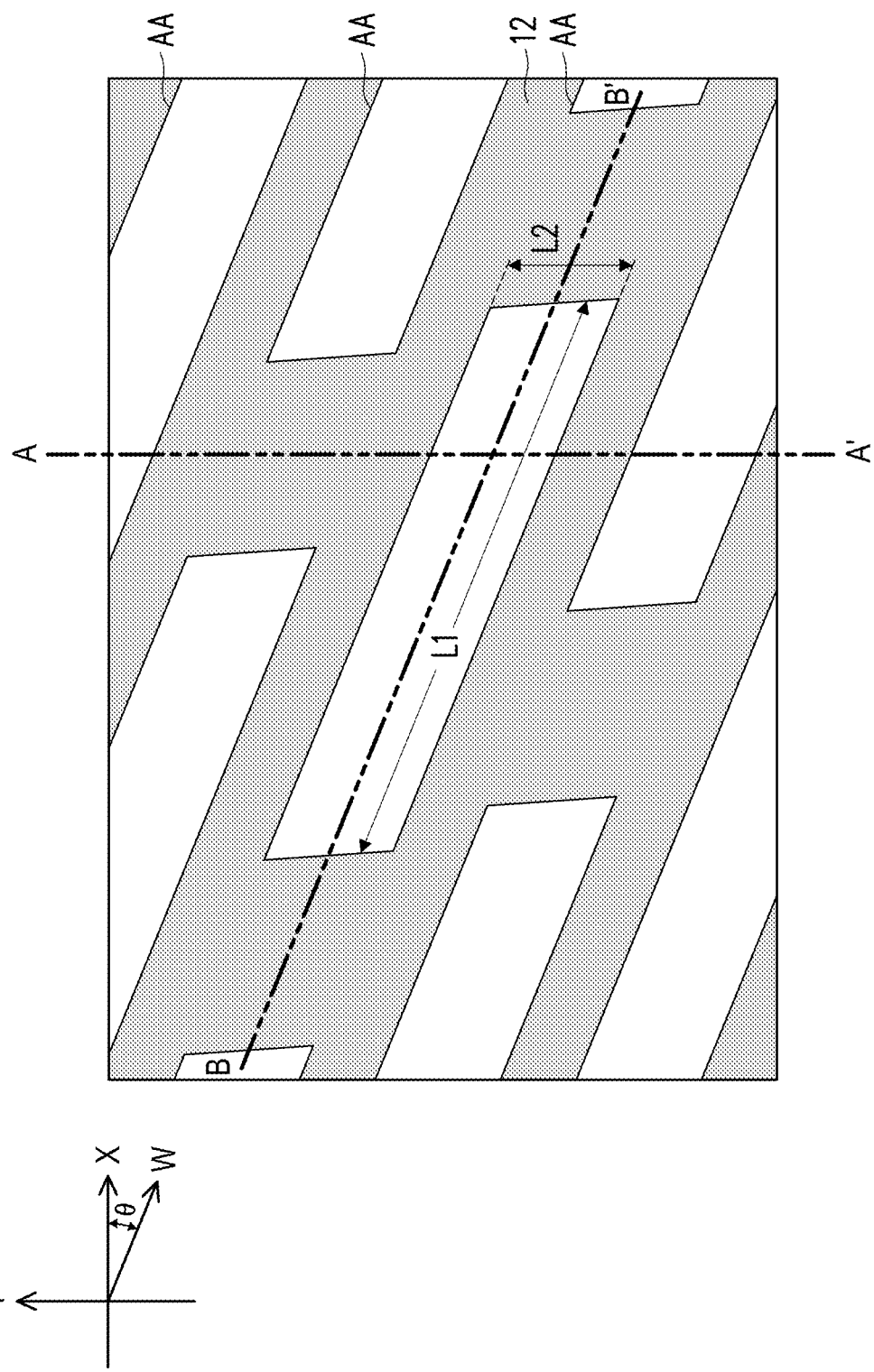
FIG. 1A to FIG. 1G are top views showing multiple stages of a DRAM fabricating method according to an embodiment of the disclosure.
Figure 3A:
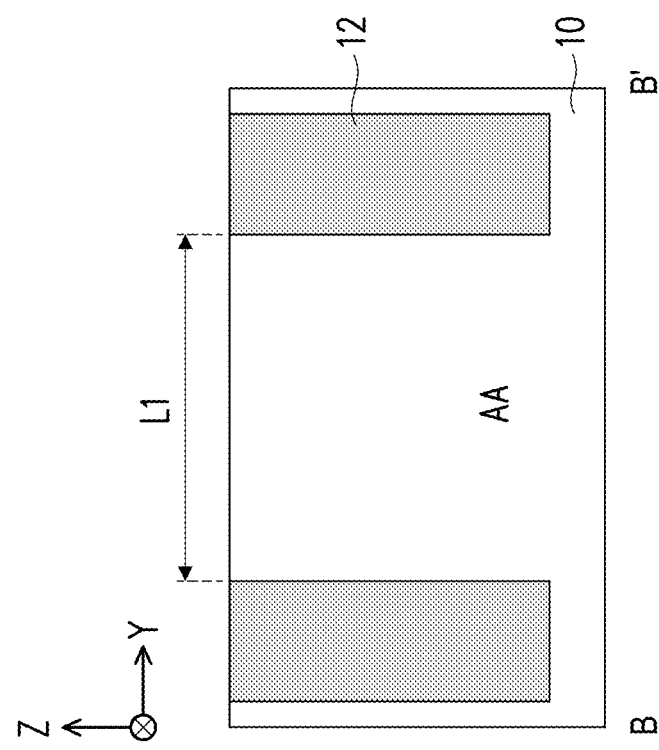
Figure 2A:
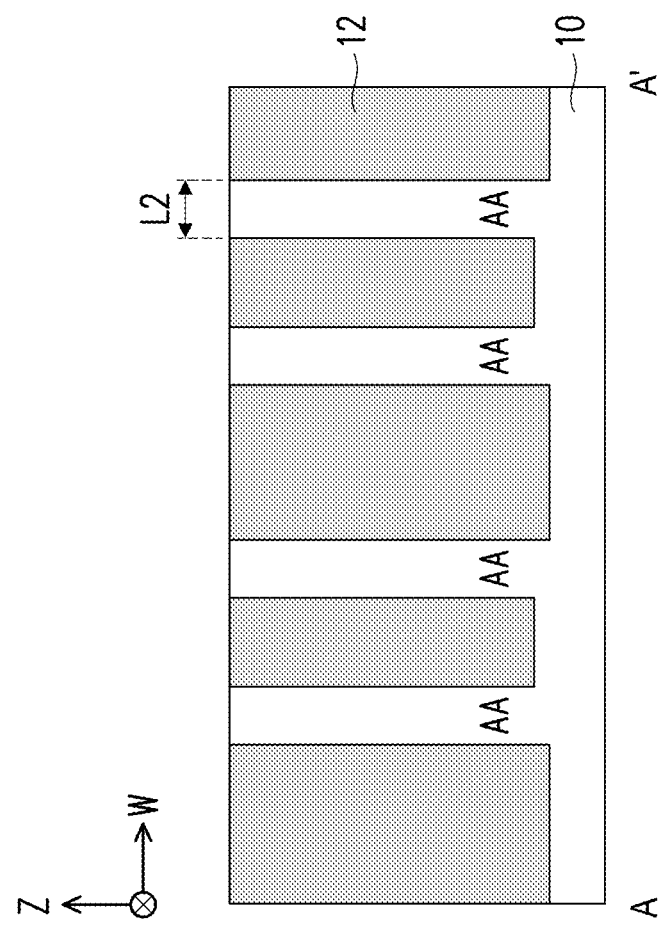

Referring to FIG. 1A, FIG. 2A, and FIG. 3A, a substrate 10 is provided. The substrate 10 may be a semiconductor substrate such as a silicon substrate. An isolation structure 12 is formed in the substrate 10 to define a plurality of active regions AA. In some embodiments, the material of the isolation structure 12 includes silicon oxide, silicon nitride, high-density plasma (HDP) oxide, spin-on silicon oxide, low-k dielectric material, or a combination thereof. The isolation structure 12 may be a shallow trench isolation (STI) structure, a deep trench isolation (DTI) structure, or a combination thereof.

The isolation structure 12 defines the active regions AA in the substrate 10. The active region AA has a strip pattern. Each active region AA has a long side L1 and a short side L2. In some embodiments, the long side L1 extends along a W direction, and the short side L2 extends along a Y direction, but the disclosure is not limited thereto. An angle θ is present between the W direction and an X direction. The angle θ may be 15° to 50°. In some embodiments, in the W direction, the active regions AA are arranged in a row, and in the Y direction, the active regions AA are staggered with respect to each other.

A hard mask layer 14 is formed on the substrate 10. The hard mask layer 14 may be a single-layer or multi-layer material. The method of forming the hard mask layer 14 includes, for example, first forming a blanket hard mask layer on the substrate 10. Then, the hard mask layer is patterned by lithography and etching processes. The material of the hard mask layer 14 includes, for example, silicon oxide, silicon nitride, or silicon oxynitride.

Figure 1B:
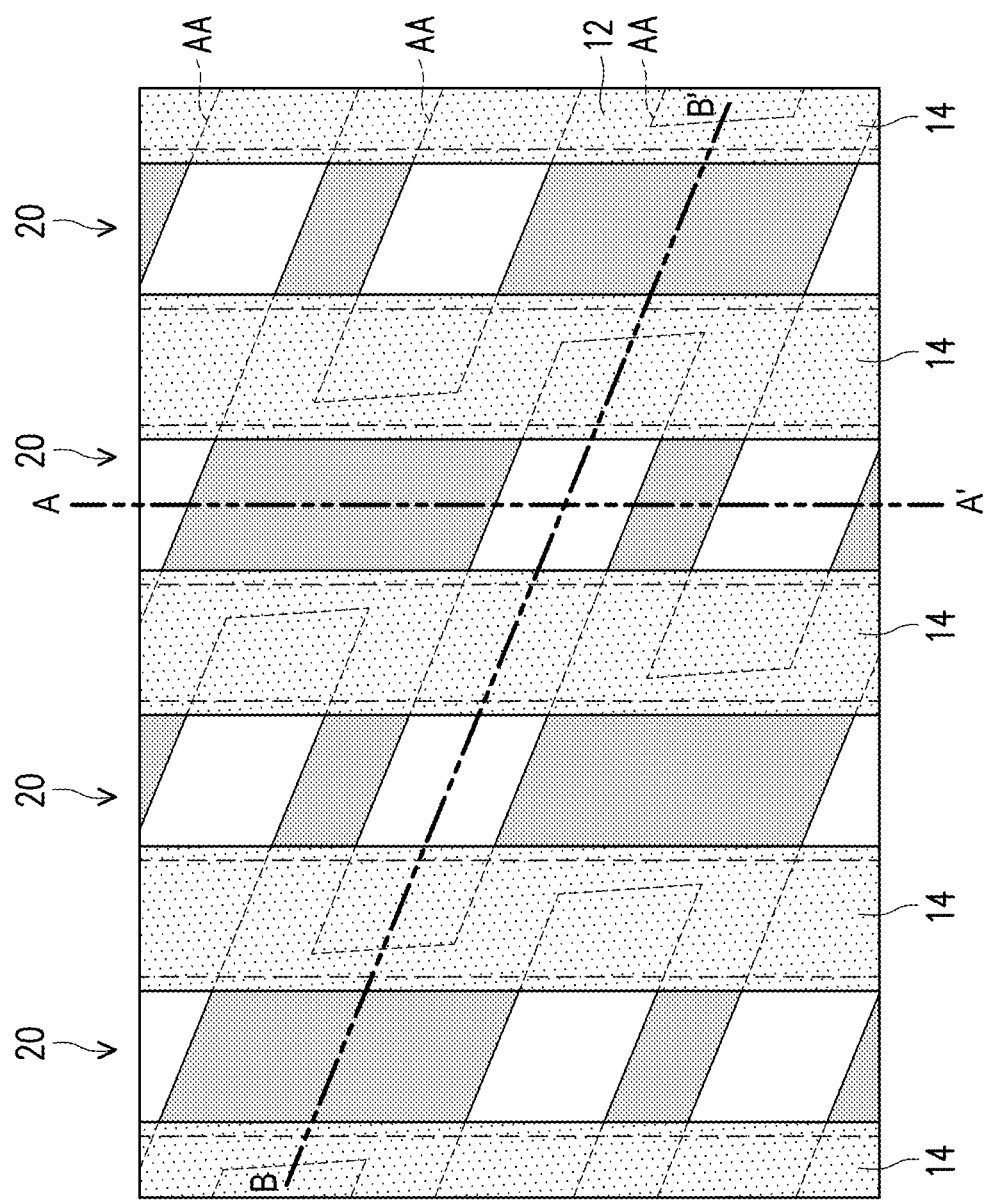

Referring to FIG. 1B, FIG. 2B, and FIG. 3B, an etching process is performed on the substrate 10 by using the hard mask layer 14 as a mask to form a plurality of buried word line trenches 20. Each buried word line trench 20 extends along the Y direction and passes through the substrate 10 of the active region AA and the isolation structure 12. The buried word line trenches 20 are arranged along the X direction. Due to the difference in the etching rate, the depth of the buried word line trenches 20 in the isolation structure 12 is larger, and the depth of the buried word line trenches 20 in the substrate 10 is smaller.

Figure 1C:
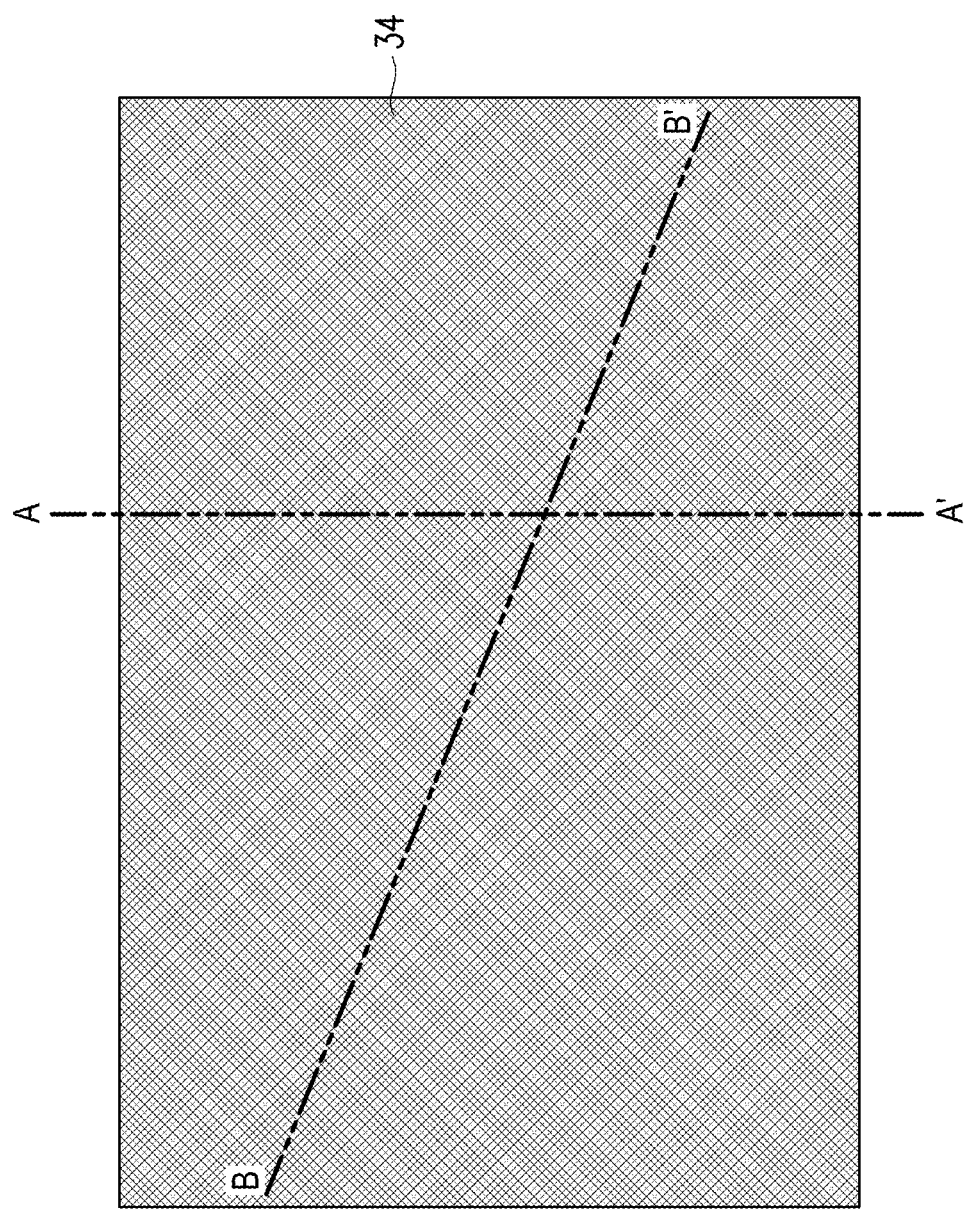
Figure 3C:
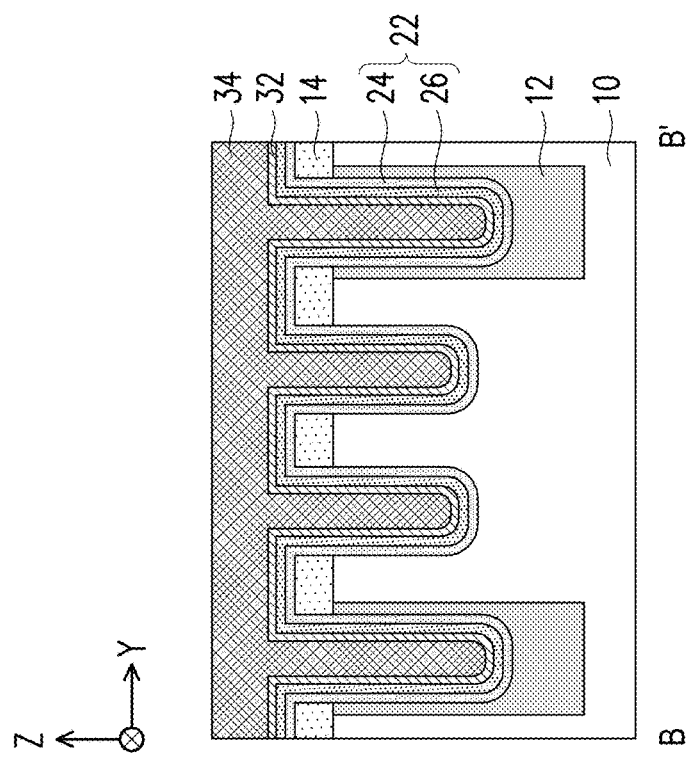
Figure 2C:
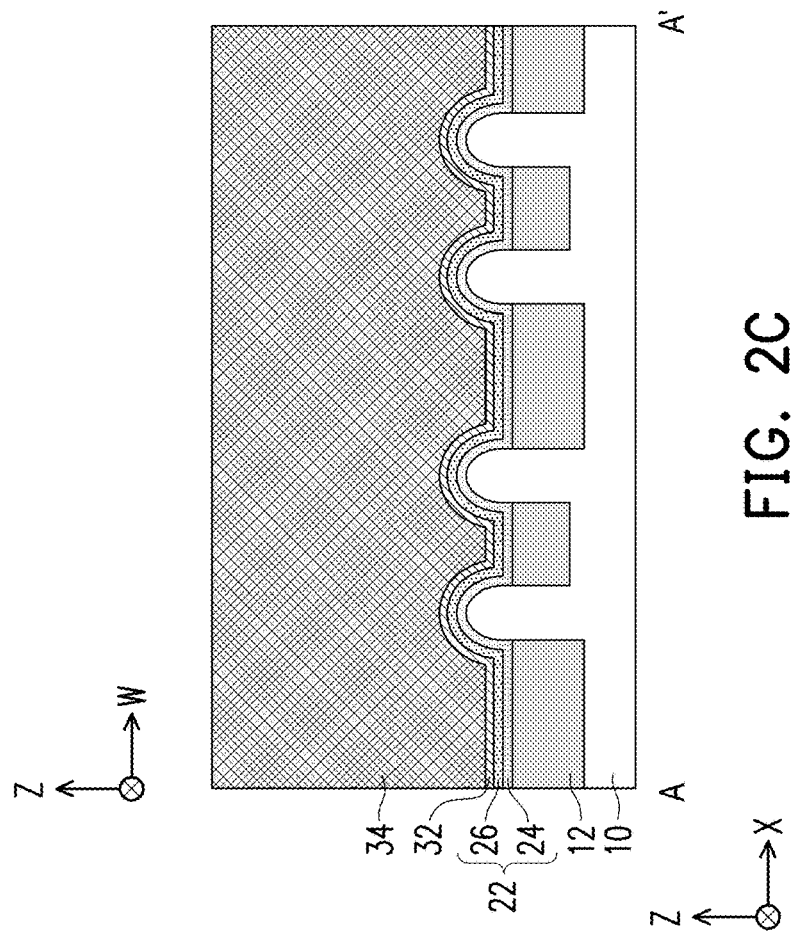
Figure 4:
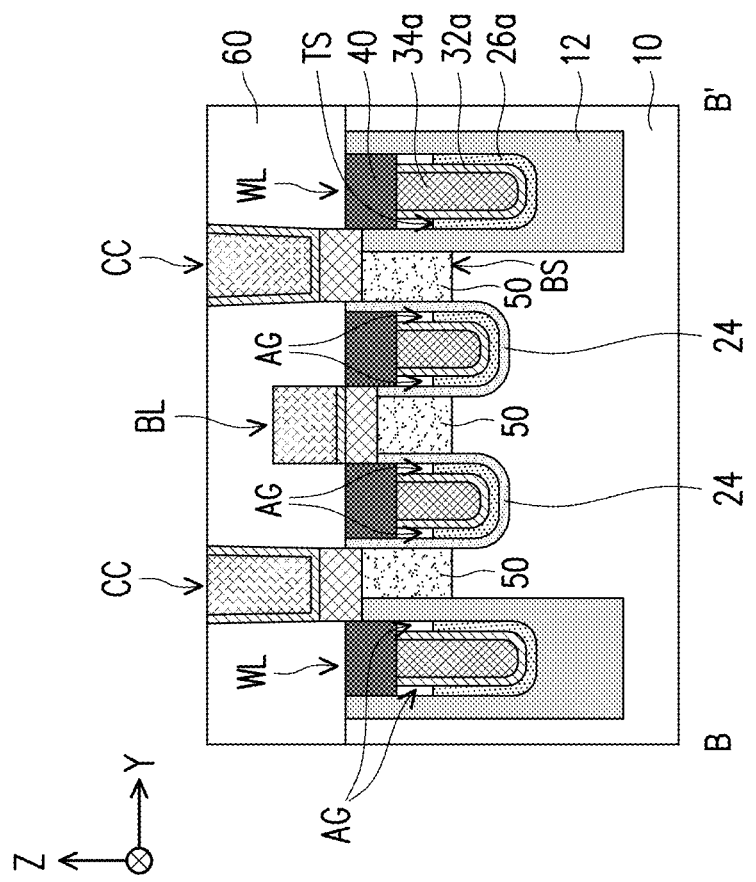
FIG. 4 is a cross-sectional view showing a DRAM according to another embodiment of the disclosure.

Referring to FIG. 1C, FIG. 2C, and FIG. 3C, a gate dielectric structure 22 and a gate conductive layer 34 are formed on the hard mask layer 14 and in the buried word line trenches 20. The gate dielectric structure 22 includes a first gate dielectric layer 24 and a second gate dielectric layer 26. The first gate dielectric layer 24 is, for example, a conformal layer which conformally covers the hard mask layer 14, and the portions of the hard mask layer 14, the isolation structure 12, and the substrate 10 that are exposed from the sidewall and bottom surface of the buried word line trenches 20. The second gate dielectric layer 26 is, for example, a conformal layer which conformally covers the first gate dielectric layer 24. The first gate dielectric layer 24 and the second gate dielectric layer 26 include dielectric materials having different dielectric constants. The dielectric constant of the second gate dielectric layer 26 is higher than the dielectric constant of the first gate dielectric layer 24. The first gate dielectric layer 24 includes, for example, silicon oxide. The second gate dielectric layer 26 includes, for example, silicon nitride or a high dielectric constant material. The high dielectric constant material may be a dielectric material having a dielectric constant greater than 7. The high dielectric constant material includes, for example, HfAlO, $HfO_2$, $ZrO_2$, $Ta_2O_5$, $Al_2O_3$, $Si_3N_4$, or a combination thereof. The first gate dielectric layer 24 may be formed by chemical vapor deposition or in-situ steam generation (ISSG). In an embodiment, the first gate dielectric layer 24 is formed by in-situ steam generation, and the isolation structure 12 is an oxide. In that case, since the oxide of the isolation structure 12 cannot be oxidized, the first gate dielectric layer 24 is not formed on the isolation structure 12 exposed from the surface of the buried word line trench 20, as shown in FIG. 4.

The gate conductive layer 34 covers the second gate dielectric layer 26. The material of the gate conductive layer 34 includes metal or metal alloy, such as doped polysilicon, tungsten, and tungsten silicide. In some embodiments, a barrier layer 32 may be further provided between the second gate dielectric layer 26 and the gate conductive layer 34. The barrier layer 32 may also be referred to as an adhesive material layer. The barrier layer 32 may be single-layer or multi-layer, and its material includes metal or metal nitride, such as titanium, titanium nitride, tantalum, tantalum nitride, or a combination thereof.

Figure 1D:
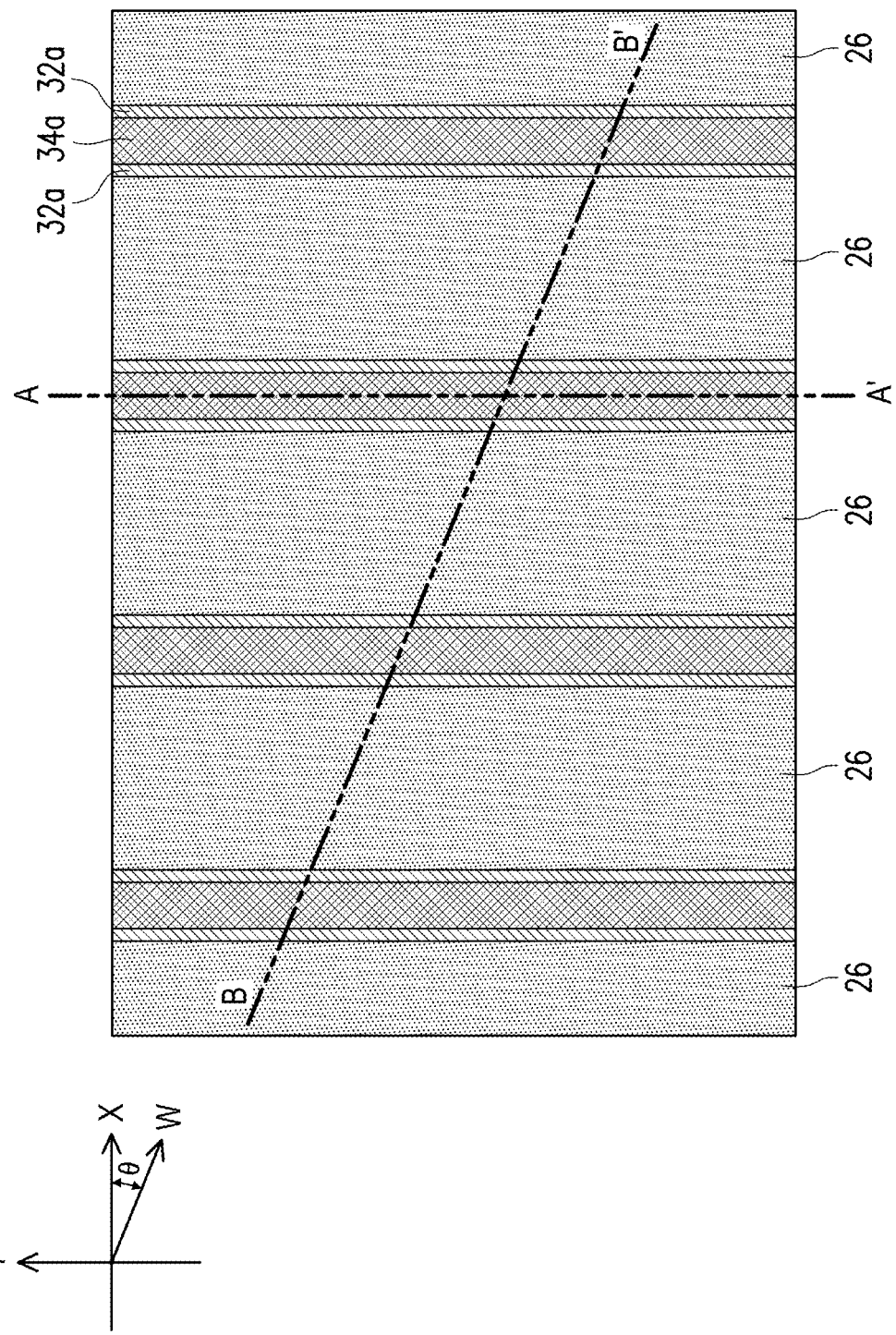
Figure 3D:
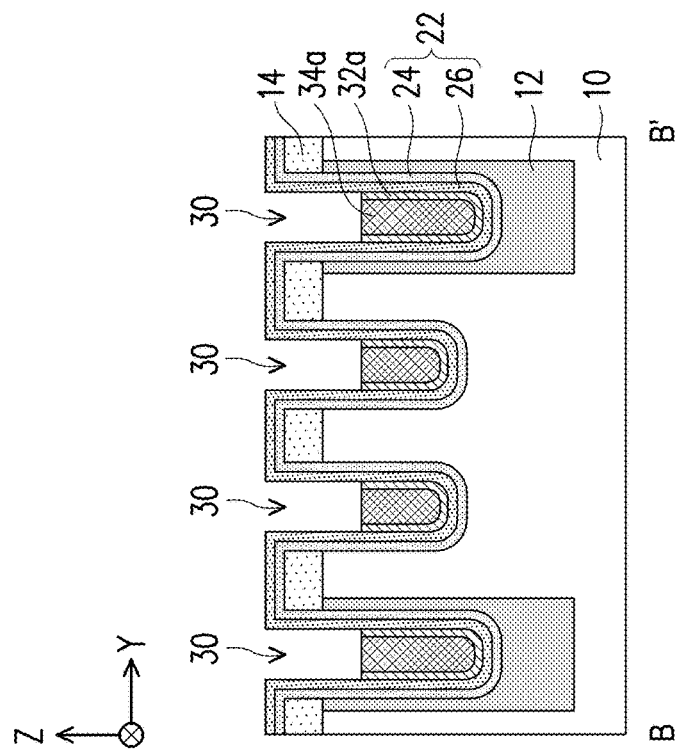
Figure 2D:
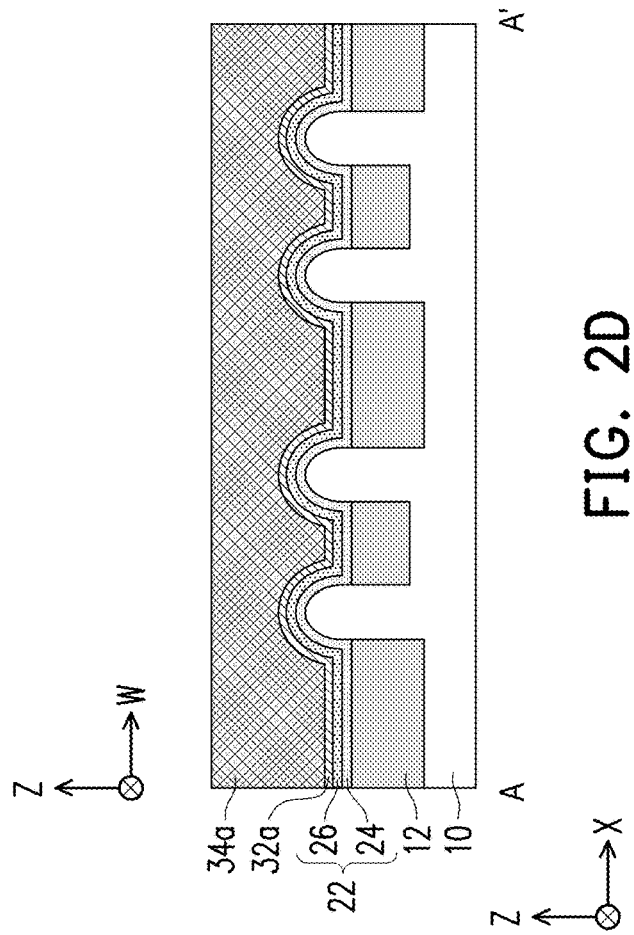

Referring to FIG. 1D, FIG. 2D, and FIG. 3D, an etching process is performed (with an optional chemical-mechanical polishing process) to remove part of the barrier layer 32 and part of the gate conductive layer 34 on the hard mask layer 14 and in the buried word line trenches 20, to form a gate conductive layer 34a and a barrier layer 32a in the buried word line trenches 20. The top surfaces of the gate conductive layer 34a and the barrier layer 32a are lower than the bottom surface of the hard mask layer 14, and the second gate dielectric layer 26 is exposed.

Figure 1E:
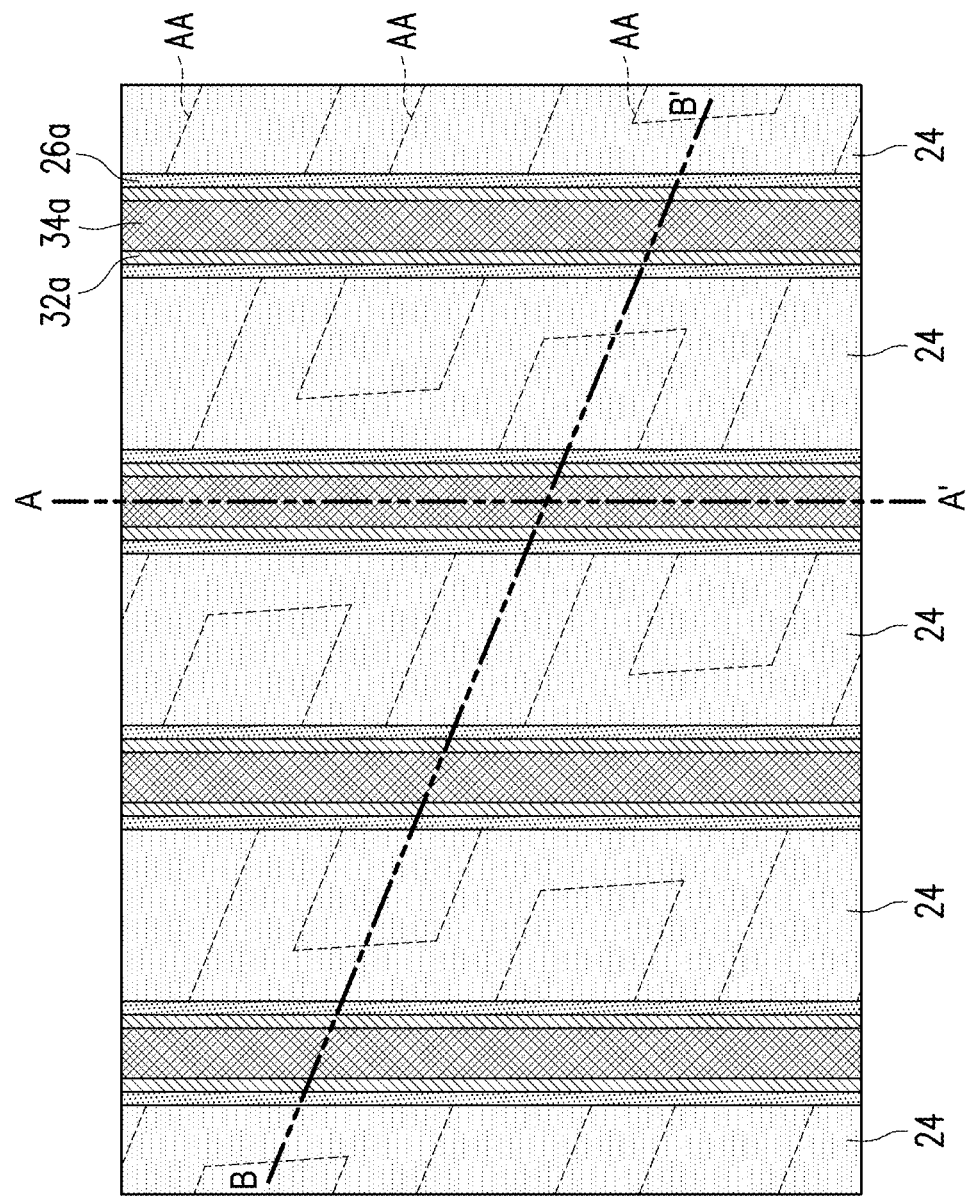
Figure 3E:
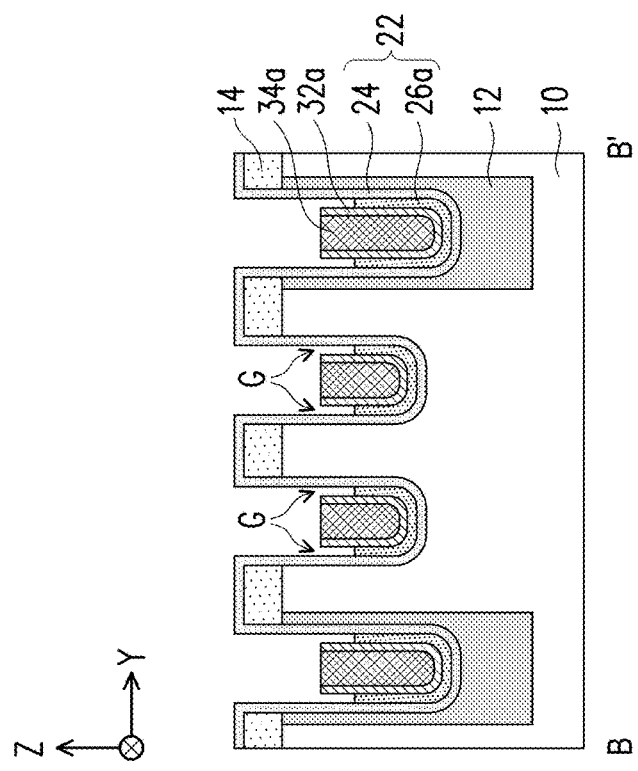
Figure 2E:
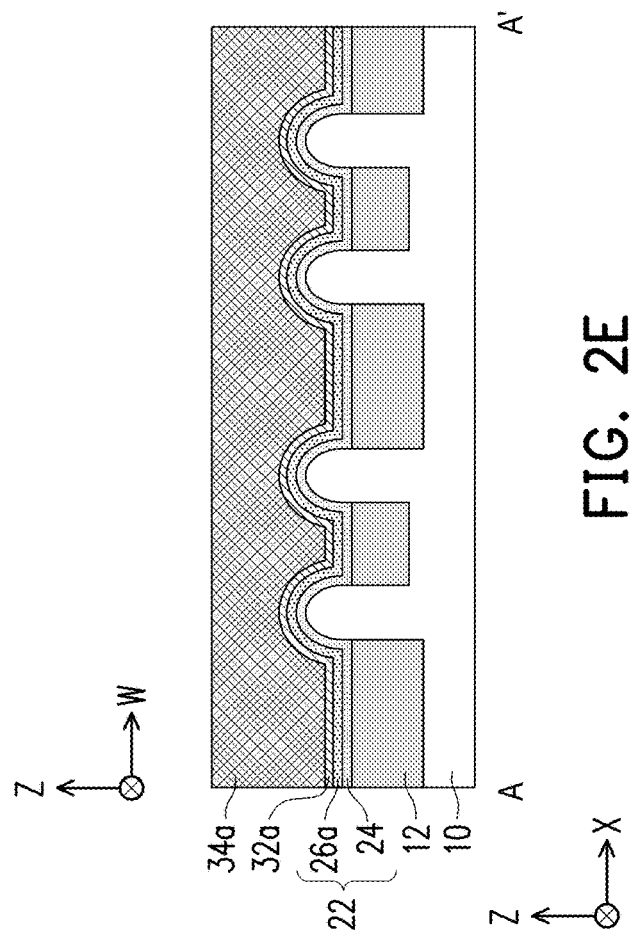

Referring to FIG. 1E, FIG. 2E, and FIG. 3E, an etch-back process is performed to remove part of the second gate dielectric layer 26 on the hard mask layer 14 and in the buried word line trenches 20 to form a second gate dielectric layer 26a. The top surface of the second gate dielectric layer 26a is lower than the top surfaces of the gate conductive layer 34a and the barrier layer 32a. A gap G is present between the first gate dielectric layer 24 and the barrier layer 32a and above the second gate dielectric layer 26a. In some embodiments, the second gate dielectric layer 26 includes silicon nitride. In some embodiments, the height of the top surface of the second gate dielectric layer 26a is greater than the height of the bottom surface of a source and drain region 50 to be formed later, so as to avoid an on-current drop ($I_{on}$ drop).

Figure 1F:
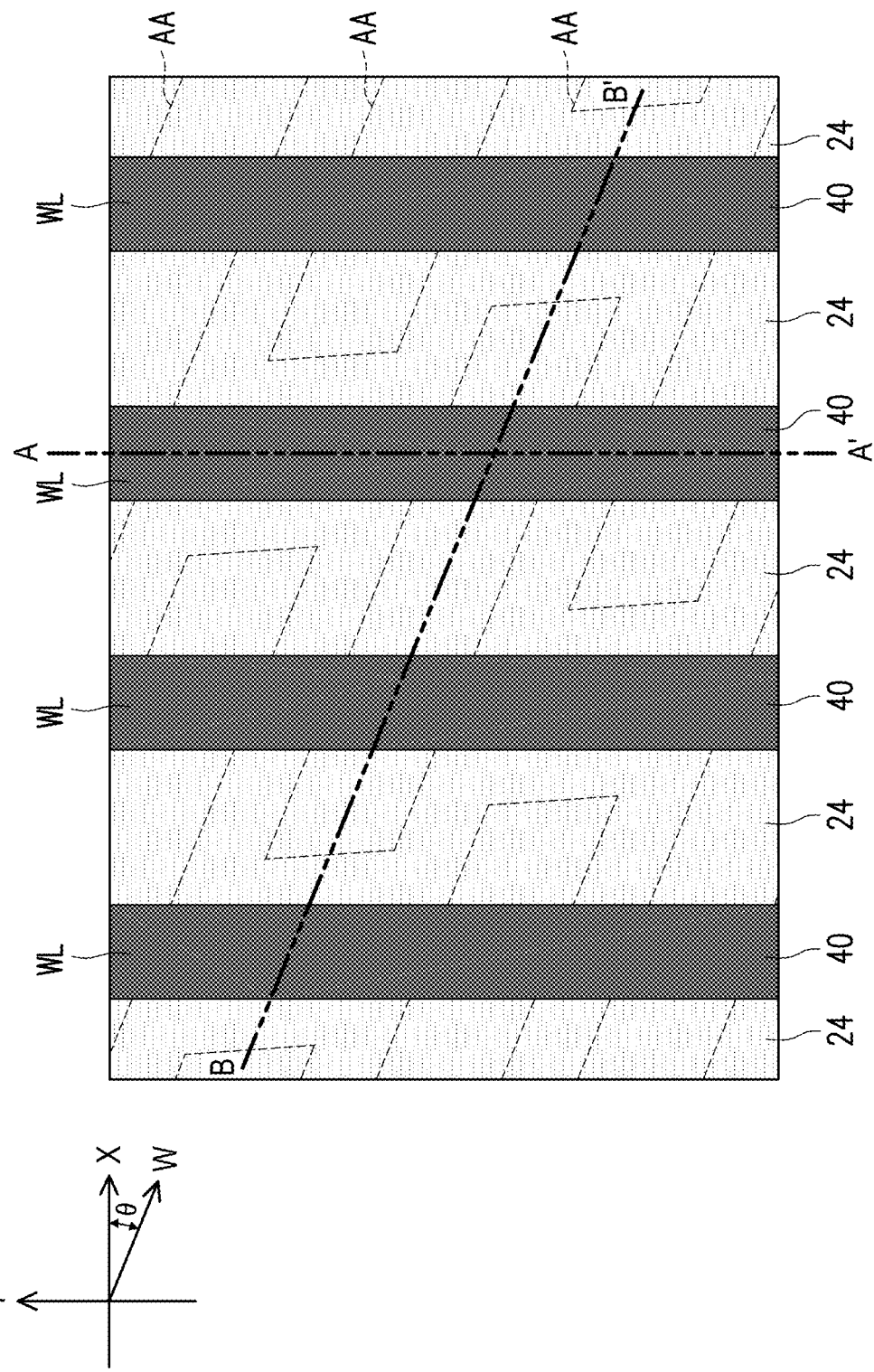
Figure 3F:
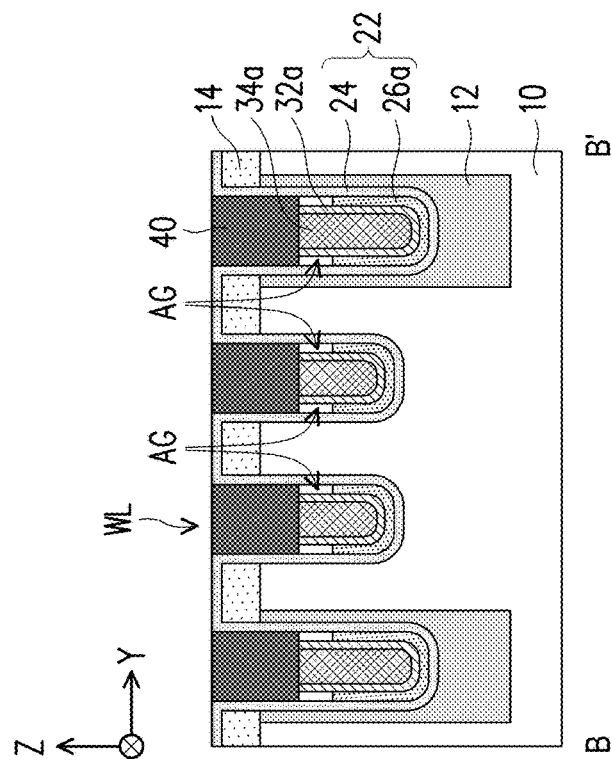
Figure 2F:
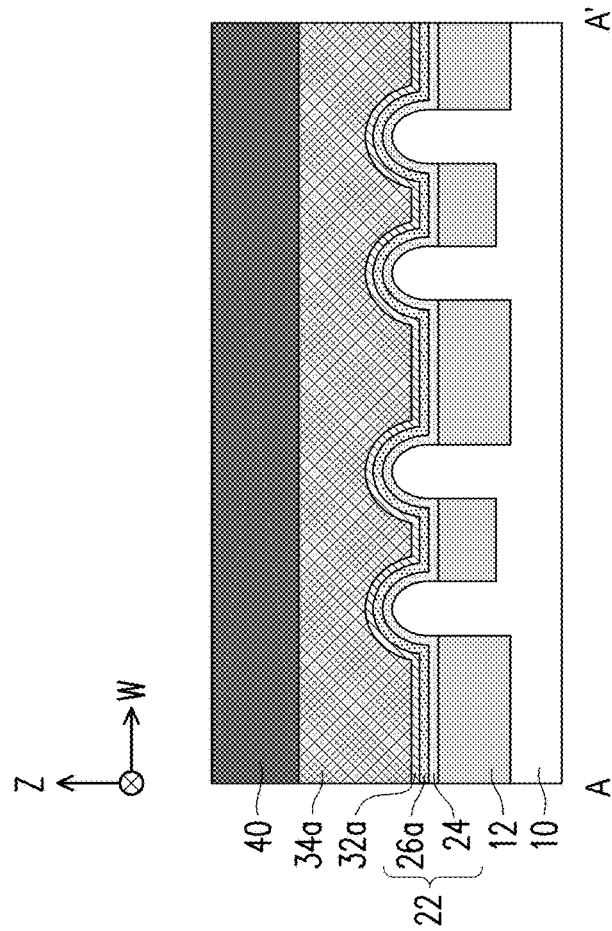

Referring to FIG. 1F, FIG. 2F, and FIG. 3F, a cap layer 40 is filled in the buried word line trenches 20. The cap layer 40 covers the top surfaces of the gate conductive layer 34a and the barrier layer 32a. The cap layer 40 does not fill the gap G or does not fully fill the gap G, so an air gap AG is formed between the first gate dielectric layer 24 and the barrier layer 32a and above the second gate dielectric layer 26a. The material of the cap layer 40 includes silicon nitride; for example, a cap material layer is covered on the first gate dielectric layer 24 and filled in the buried word line trenches 20, and then the cap material layer covering the first gate dielectric layer 24 is removed by an etch-back process or a chemical-mechanical polishing process.

The first gate dielectric layer 24, the second gate dielectric layer 26a, the barrier layer 32a, and the gate conductive layer 34a form a buried word line structure WL having an air gap AG.

Figure 1G:
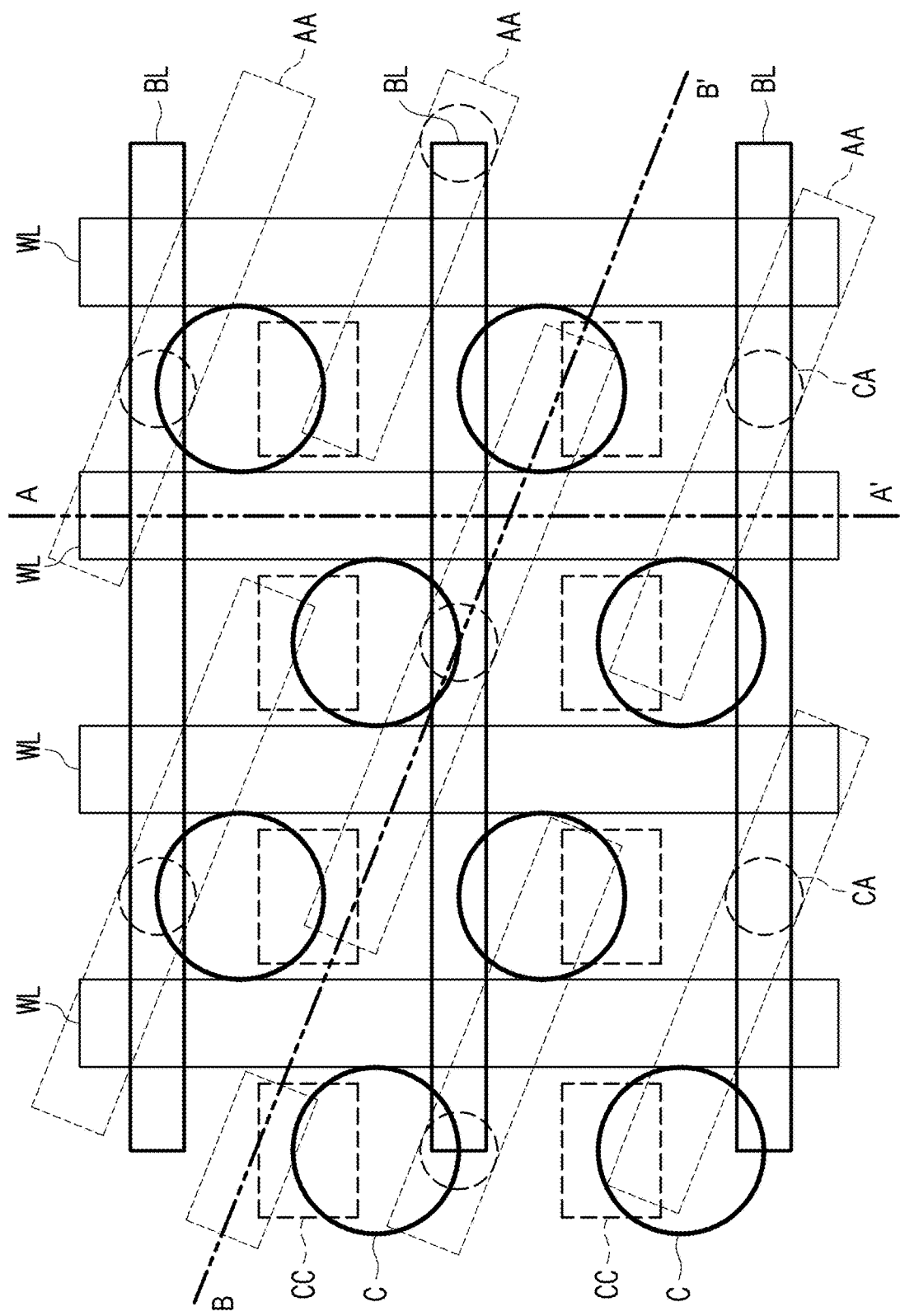

Referring to FIG. 1G, FIG. 2G, and FIG. 3G, a source and drain region 50 is formed in the substrate 10 of the active region AA on two sides of the buried word line structure WL.

Subsequent processes are performed. The subsequent processes include, for example, processes for forming a dielectric layer 60, a bit line contact CA, a bit line BL, a capacitor contact CC, and a capacitor C on the substrate 10. The dielectric layer 60 may be multi-layered or may be formed in multiple stages.

In some embodiments, a junction surface BS of the source and drain region 50 is lower than a top surface TS of the second gate dielectric layer 26a, so that the source and drain region 50 and the second gate dielectric layer 26a overlap in the lateral direction. Since the second gate dielectric layer 26a includes a dielectric material having a higher dielectric constant, it is possible to increase the coupling effect during operation, increase the width of the depletion layer, and thereby increase the on-current $I_{on}$.

In some embodiments, the first gate dielectric layer 24 has a dielectric constant of 3.9 and a thickness of 3 nm, the second gate dielectric layer 26a has a dielectric constant of 25 and a thickness of 4 nm, and the on-current $I_{on}$ can be increased to 265% of the original current. In other embodiments, the first gate dielectric layer 24 has a dielectric constant of 3.9 and of thickness of 2 nm, the second gate dielectric layer 26a has a dielectric constant of 25 and a thickness of 5 nm, and the on-current $I_{on}$ can be increased to 331% of the original current. In other embodiments, the first gate dielectric layer 24 has a dielectric constant of 3.9 and a thickness of 1.5 nm, the second gate dielectric layer 26a has a dielectric constant of 25 and a thickness of 5.5 nm, and the on-current $I_{on}$ can be increased to 364% of the original current.

Since the second gate dielectric layer 26a includes a dielectric material having a higher dielectric constant, it can be made thicker. Therefore, it is possible to improve and avoid the problem of gate-induced drain leakage (GIDL) resulting from the reduced thickness of the gate dielectric layer for increasing the coupling effect. In some embodiments, the first gate dielectric layer 24 has a dielectric constant of 3.9 and a thickness of 3 nm, the air gap AG has a dielectric constant of 1 and a thickness of 4 nm, and the GIDL can be reduced by 50%. In other embodiments, the first gate dielectric layer 24 has a dielectric constant of 3.9 and a thickness of 2 nm, the air gap AG has a dielectric constant of 1 and a thickness of 4 nm, and the GIDL can be reduced by 62%. In other embodiments, the first gate dielectric layer 24 has a dielectric constant of 3.9 and a thickness of 1.5 nm, the air gap AG has a dielectric constant of 1 and a thickness of 5.5 nm, and the GIDL can be reduced by 68%.

The source and drain region 50 and the gate conductive layer 34a are laterally separated by the air gap AG. Since the dielectric constant of the air gap AG is only 1, it is possible to reduce the electric field, thereby reduce the gate-induced drain leakage (GIDL), and reduce the leakage current due to the depletion layer in the substrate 10 near the source and drain region 50 formed by the gate conductive layer 34a which passes through the isolation structure 12.

In the embodiment of the disclosure, in the buried word line trench 20, the first gate dielectric layer 24 is first formed, and then the second gate dielectric layer 26 is formed. Compared to the second gate dielectric layer 26, the first gate dielectric layer 24 has a more desirable surface flatness. Therefore, it is possible to avoid electrical problems caused by an undesirable surface flatness in the case of directly forming the second gate dielectric layer 26 in the buried word line trench 20. Accordingly, the embodiment of the disclosure can increase the reliability of the device.

In addition, the end of the second gate dielectric layer 26 is removed to form the air gap AG. Therefore, it is possible to mitigate the problem of leakage due to an excessively thin end of the gate dielectric layer to thereby increase the reliability of the gate dielectric layer.

In addition, the material and thickness of the first gate dielectric layer 24 and the second gate dielectric layer 26, and the depth of the air gap AG may all be flexibly adjusted according to the electrical properties or characteristics of the device as required.

In the fabricating process of the disclosure, it is not required to add an additional mask for patterning the first gate dielectric layer 24 or/and the second gate dielectric layer 26, so the production cost will not be significantly increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A dynamic random access memory comprising:
    a substrate;
    an isolation structure located in the substrate, wherein the isolation structure defines a plurality of active regions; and
    a buried word line structure located in a word line trench of the substrate, wherein the word line trench passes through the active regions and the isolation structure, and the buried word line structure comprises:
        a gate conductive layer located in the word line trench;
        a first gate dielectric layer located on a sidewall and a bottom surface of the word line trench; and
        a second gate dielectric layer located between the first gate dielectric layer and the gate conductive layer, wherein a top surface of the second gate dielectric layer is lower than a top surface of the gate conductive layer,
    wherein an air gap is present between the gate conductive layer and the first gate dielectric layer and above the second gate dielectric layer.

2. The dynamic random access memory according to claim 1, wherein the first gate dielectric layer and the second gate dielectric layer comprise dielectric materials having different dielectric constants.

3. The dynamic random access memory according to claim 1, wherein a dielectric constant of the second gate dielectric layer is greater than a dielectric constant of the first gate dielectric layer.

4. The dynamic random access memory according to claim 1, further comprising a plurality of source and drain regions located in the active region on two sides of the buried word line structure, wherein a depth of a junction surface of the source and drain region is lower than the top surface of the second gate dielectric layer.

5. The dynamic random access memory according to claim 1, wherein the buried word line structure further comprises a cap layer located in the word line trench and covering the gate conductive layer.

6. The dynamic random access memory according to claim 1, wherein the buried word line structure further comprises a barrier layer located in the word line trench and located between the gate conductive layer and the second gate dielectric layer.

7. The dynamic random access memory according to claim 6, wherein the buried word line structure further comprises a cap layer located in the word line trench and covering the gate conductive layer and the barrier layer.

8. The dynamic random access memory according to claim 6, wherein the first gate dielectric layer further located between the isolation structure and the second gate dielectric layer.

9. The dynamic random access memory according to claim 8, wherein the air gap is present laterally between the barrier layer and the first gate dielectric layer, and vertically between the second gate dielectric layer and the cap layer.

10. The dynamic random access memory according to claim 7, wherein the second gate dielectric layer is in contact with the isolation structure.

11. The dynamic random access memory according to claim 10, wherein another air gap is present laterally between the barrier layer and the isolation structure, and vertically between the second gate dielectric layer and the cap layer.

12. A method of fabricating a dynamic random access memory, comprising:
    providing a substrate;
    forming an isolation structure in the substrate, wherein the isolation structure defines a plurality of active regions;
    forming a word line trench in the substrate and the isolation structure, wherein the word line trench passes through the active regions and the isolation structure; and forming a buried word line structure in the word line trench, comprising:
  forming a first gate dielectric layer, a second gate dielectric layer, and a gate conductive layer on the substrate and in the word line trench, wherein a dielectric constant of the second gate dielectric layer is greater than a dielectric constant of the first gate dielectric layer;
  removing the gate conductive layer outside the word line trench and part of the gate conductive layer in the word line trench;
  removing the second gate dielectric layer outside the word line trench and part of the second gate dielectric layer in the word line trench, so that a top surface of the remaining second gate dielectric layer is lower than a top surface of the remaining gate conductive layer; and
  forming a cap in the word line trench to cover the top surface of the remaining gate conductive layer.

13. The method of fabricating a dynamic random access memory according to claim 12, wherein an air gap is formed between the gate conductive layer and the first gate dielectric layer and above the second gate dielectric layer.

14. The method of fabricating a dynamic random access memory according to claim 12, further comprising forming a plurality of source and drain regions in the active region on two sides of the buried word line structure, wherein a depth of a junction surface of the source and drain region is lower than the top surface of the second gate dielectric layer.

15. The method of fabricating a dynamic random access memory according to claim 12, further comprising forming a barrier layer, wherein the barrier layer is located in the word line trench and located between the gate conductive layer and the second gate dielectric layer.

16. The method of fabricating a dynamic random access memory according to claim 15, wherein the first gate dielectric layer is further formed between the isolation structure and the second gate dielectric layer.

17. The method of fabricating a dynamic random access memory according to claim 15, wherein the second gate dielectric layer is formed to be in contact with the isolation structure.

18. The method of fabricating a dynamic random access memory according to claim 17, wherein the first gate dielectric layer is formed by in-situ steam generation (ISSG).

19. The method of fabricating a dynamic random access memory according to claim 17, wherein another air gap is laterally present between the barrier layer and the isolation structure, and vertically between the second gate dielectric layer and the cap layer.

* * * * *